(12) United States Patent
Zhu et al.

(10) Patent No.: US 7,288,451 B2
(45) Date of Patent: Oct. 30, 2007

(54) METHOD AND STRUCTURE FOR FORMING SELF-ALIGNED, DUAL STRESS LINER FOR CMOS DEVICES

(75) Inventors: Huilong Zhu, Poughkeepsie, NY (US); Huicai Zhong, Wappingers Falls, NY (US); Effendi Leobandung, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 10/906,669

(22) Filed: Mar. 1, 2005

(65) Prior Publication Data
US 2006/0199326 A1 Sep. 7, 2006

(51) Int. Cl.
*H01L 21/8238* (2006.01)
(52) U.S. Cl. ................ 438/228; 438/938; 257/E21.633
(58) Field of Classification Search ................ 438/228, 438/910, 938; 257/E21.633
See application file for complete search history.

(56) References Cited

U.S. PATENT DOCUMENTS

| | | | |
|---|---|---|---|
| 4,851,370 A | 7/1989 | Doklan et al. | |
| 5,506,169 A | 4/1996 | Guldi | |
| 5,538,916 A | 7/1996 | Kuroi et al. | |
| 5,580,815 A | 12/1996 | Hsu et al. | |
| 5,620,919 A | 4/1997 | Godinho et al. | |
| 5,633,202 A | 5/1997 | Brigham et al. | |
| 5,633,552 A | 5/1997 | Lee et al. | |
| 5,668,403 A | 9/1997 | Kunikiyo | |
| 5,707,889 A | 1/1998 | Hsu et al. | |
| 5,847,463 A | 12/1998 | Trivedi et al. | |
| 5,851,893 A | 12/1998 | Gardner et al. | |
| 5,891,798 A | 4/1999 | Doyle et al. | |
| 5,908,312 A | 6/1999 | Cheung et al. | |
| 5,936,300 A * | 8/1999 | Sasada et al. | ................ 257/632 |
| 5,985,737 A | 11/1999 | Wu | |
| 6,040,619 A | 3/2000 | Wang et al. | |
| 6,046,494 A | 4/2000 | Brigham et al. | |
| 6,146,975 A | 11/2000 | Kuehne et al. | |
| 6,214,733 B1 | 4/2001 | Sickmiller | |
| 6,228,777 B1 | 5/2001 | Arafa et al. | |

(Continued)

OTHER PUBLICATIONS

T. H. Ning; "Why BiCMOS and SOI BiCMOS?;" IBM J. Res & Dev. vol. 46 No. 2/3 Mar./May 2002; pp. 181-186.

(Continued)

*Primary Examiner*—Chandra Chaudhari
(74) *Attorney, Agent, or Firm*—Cantor Colburn LLP; Todd M. C. Li

(57) ABSTRACT

A method for forming a self-aligned, dual stress liner for a CMOS device includes forming a first type stress layer over a first polarity type device and a second polarity type device, and forming a sacrificial layer over the first type nitride layer. Portions of the first type stress layer and the sacrificial layer over the second polarity type device are patterned and removed. A second type stress layer is formed over the second polarity type device, and over remaining portions of the sacrificial layer over the first polarity type device in a manner such that the second type stress layer is formed at a greater thickness over horizontal surfaces than over sidewall surfaces. Portions of the second type stress liner on sidewall surfaces are removed, and portions of the second type stress liner over the first polarity type device are removed.

13 Claims, 22 Drawing Sheets

U.S. PATENT DOCUMENTS

| | | |
|---|---|---|
| 6,261,924 B1 | 7/2001 | Mandelman et al. |
| 6,306,742 B1 | 10/2001 | Doyle et al. |
| 6,395,610 B1 | 5/2002 | Roy et al. |
| 6,436,848 B1 | 8/2002 | Ramkumar |
| 6,476,462 B2 | 11/2002 | Shimizu et al. |
| 6,509,230 B1 | 1/2003 | Roy et al. |
| 6,515,351 B2 | 2/2003 | Arafa et al. |
| 6,573,172 B1 | 6/2003 | En et al. |
| 6,653,181 B2 * | 11/2003 | Hergenrother et al. ...... 438/206 |
| 6,724,053 B1 | 4/2004 | Divakaruni et al. |
| 6,825,529 B2 | 11/2004 | Chidambarrao et al. |

OTHER PUBLICATIONS

T. G. Ference et al., "The Combined Effects of Deuterium Anneals and Deuterated Barrier-Nitride Processing On Hot-Electron Degradation in MOSFET's;" IEEE Transactions of Electron Devices, vol. 46, No. 4, Apr. 1999; pp. 747-753.

J. H Stathis; "Reliability limits for the gate insulator in CMOS technology;" IBM J. Res & Dev. vol. 46 No. 2/3 Mar./May 2002; pp. 265-286.

U.S. Appl. No. 10/711,897, filed Dec. 12, 2004.

* cited by examiner

METHOD AND STRUCTURE FOR FORMING SELF-ALIGNED, DUAL STRESS LINER FOR CMOS DEVICES

BACKGROUND

The present invention relates generally to semiconductor device processing techniques, and, more particularly, to a method and structure for improving CMOS device reliability by forming a self-aligned, dual stress liner (SDSL).

Hot carrier effects in metal oxide semiconductor field effect transistor (MOSFET) devices are caused by high electric fields at the end of the channel, near the source/drain diffusion regions. More specifically, electrons that acquire great energy when passing through the high-field region can generate electron-hole pairs due to, for example, impact ionization, thus resulting in high gate leakage and early gate oxide breakdown by injecting hot carriers through the gate oxide to the gate material. As a further result, there is also a net negative charge density in the gate dielectric. The trapped charge accumulates with time, resulting in a positive threshold shift in the NMOS transistor, or a negative threshold shift in a PMOS transistor.

Since hot electrons are more mobile than hot holes, hot carrier effects cause a greater threshold skew in NMOS transistors than in PMOS transistors. Nonetheless, a PMOS transistor will still undergo negative threshold skew if its effective channel length ($L_{eff}$) is less than, for example, 0.8 microns (μm). Thin gate oxides by today's standards (e.g., less than 1.5 nanometers) tend to be less sensitive to hot carrier degradation, as the hot carrier can readily tunnel through a thin gate oxide. On the other hand, thicker gate oxide devices (e.g., more than 1.5 nanometers) are more vulnerable to hot carrier degradation, due to the fact that the hot carriers tend to accumulate in the oxide over time. Thus, for certain application specific integrated circuits such as input/output circuitry, there may be some devices on a single chip that are formed with thicker gate oxides with respect to other devices on the chip (e.g., logic or analog circuit transistors).

Existing approaches to reducing the effects of hot carrier degradation include the addition of impurities such as nitrogen, fluorine and chlorine to the gate oxide. However, the addition of impurities can be less effective for thicker gate oxides since the impurities (such as nitrogen) tend to be localized at the surface of the film. Moreover, the direct nitridation of a gate oxide can also be accompanied by unwanted effects, such as degradation of electron mobility.

Another technique that has been disclosed for improving device life due to hot carrier effects is the use of deuterium anneals. By substituting deuterium for hydrogen at the standard interface passivation anneal step, the lifetime of an NFET device can be improved by a factor of about 10-100. However, the deuterium anneal has to be performed at a sufficiently high temperature (e.g., over 500° C.) to be effective, which may cause dopant deactivation resulting in device degradation. Additional information regarding deuterium anneals may be found in the publication of Thomas G. Ference, et al., "*The Combined Effects of Deuterium Anneals and Deuterated Barrier-Nitride Processing on Hot-Electron Degradation in MOSFET's*," IEEE Transactions on Electron Devices, Vol. 46, No. 4, April, 1999, pp. 747-753. Again, however, this technique is also generally applied to thinner gate oxides.

More recently, dual liner techniques have been introduced in order to provide different stresses in P-type MOS devices with respect to N-type MOS devices. For example, a nitride liner of a first type is formed over PFETs of a CMOS device, while a nitride liner of a second type is formed over the NFETs of the CMOS device. More specifically, it has been discovered that the application of a compressive stress in a PFET channel improves carrier mobility therein, while the application of a tensile stress in an NFET channel improves carrier mobility therein. Thus, the first type nitride liner over the PFET devices is formed in a manner so as to achieve a compressive stress, while the first type nitride liner over the PFET devices is formed in a manner so as to achieve a compressive stress.

For such CMOS devices employing dual liners, the conventional approach has been to form the two different nitrides using separate lithographic patterning steps. In other words, for example, the first type nitride liner is formed over both PFET and NFET devices, with the portions of the first type nitride liner over the NFET devices being thereafter patterned and removed. After an optional formation of an oxide layer, the second type nitride liner is formed over both regions, with a second patterning step being used to subsequently remove the portions of the second type nitride liner over the PFET devices. Unfortunately, due to inherent inaccuracies associated with aligning lithographic levels to previous levels, the formation of the two liners could result in a gap or underlap therebetween. In particular, this gap will cause problems for subsequent etching of holes for metal contact vias since, during the etching, the silicide in the underlap/gap areas will be over etched. This in turn will increase sheet resistance of the silicide.

On the other hand, the two liners could also be formed in a manner such that one liner overlaps the other. In fact, the reticles used for the two separate patterning steps are typically designed to ensure an overlap such that there is no gap between the two liner materials. However, having certain regions with overlapping nitride liners creates other problems with subsequent processing due to issues such as reliability and layout inefficiencies. For example, a reactive ion etch (RIE) process for subsequent contact formation may have to accommodate for a single-thickness liner in some areas of the circuit, while also accommodating for a double-thickness (overlapping) liner in the interface areas. Moreover, if such overlapping areas are excluded from contact formation, a restriction results in terms of available layout area and critical dimension (CD) tolerances. The overlap will also cause problems during subsequent etching of holes for metal contact vias since, during the etching, all of silicide will be over etched except for the silicide under the overlap areas. This can increase sheet resistance and junction leakage of devices.

Accordingly, it would be desirable to be able to implement the formation of a dual liner CMOS device in a self-aligned manner that does not result in a gap between different liner types and/or an overlap thereof.

SUMMARY

The foregoing discussed drawbacks and deficiencies of the prior art are overcome or alleviated by a method for forming a self-aligned, dual stress liner for a complementary metal oxide semiconductor (CMOS) device. In an exemplary embodiment, the method includes forming a first type stress layer over a first polarity type device and a second polarity type device, and stress layer and the sacrificial layer over the second polarity type device are patterned and removed. A second type stress layer is formed over the second polarity type device, and over remaining portions of the sacrificial layer over the first polarity type device in a manner such that the second type stress layer is formed at a greater thickness over horizontal surfaces than over sidewall surfaces. Portions of the second type stress liner on sidewall surfaces are removed, and portions of the second type stress liner over the first polarity type device are removed.

In another embodiment, a method for forming a self-aligned, dual material liner for semiconductor devices includes forming a first type layer over a substrate and forming a sacrificial layer over the first type layer. Portions of the first type layer and the sacrificial layer are patterned and removed over a first area of the substrate. A second type layer is formed over the first area of the substrate, and over remaining portions of the sacrificial layer over a second area of the substrate in a manner such that the second type layer is formed at a greater thickness over horizontal surfaces than over sidewall surfaces. Portions of the second type liner on sidewall surfaces and portions of the second type nitride liner over the second area of the substrate are removed.

In still another embodiment, a complementary metal oxide semiconductor (CMOS) device includes a first type stress layer formed over a first polarity type device and a second type stress layer formed over a second type device, the second type stress layer self-aligned with the first type stress layer. One of the first and said second polarity type device has at least a portion of sidewall spacer material associated therewith removed during self-alignment with the other of the first and said second polarity type device.

BRIEF DESCRIPTION OF THE DRAWINGS

Referring to the exemplary drawings wherein like elements are numbered alike in the several Figures.

DETAILED DESCRIPTION

Disclosed herein is a method and structure for improving CMOS device reliability by forming a self-aligned, dual silicon nitride liner. Briefly stated, the embodiments disclosed herein result in the elimination of an overlap region between two types of nitride liner while still maintaining a continuous liner across the device to act as an effective diffusion barrier. The two nitride liners are joined at sharply defined, self-aligned interface therebetween, thus forming a continuous and uniform single nitride layer so as not to complicate subsequent contact etching processes and/or result in additionally restrictive ground rules. The principles of the embodiments described herein could also be generally applied where it is desired to form a uniform, single layer material from two separate layer materials.

Figure 1:
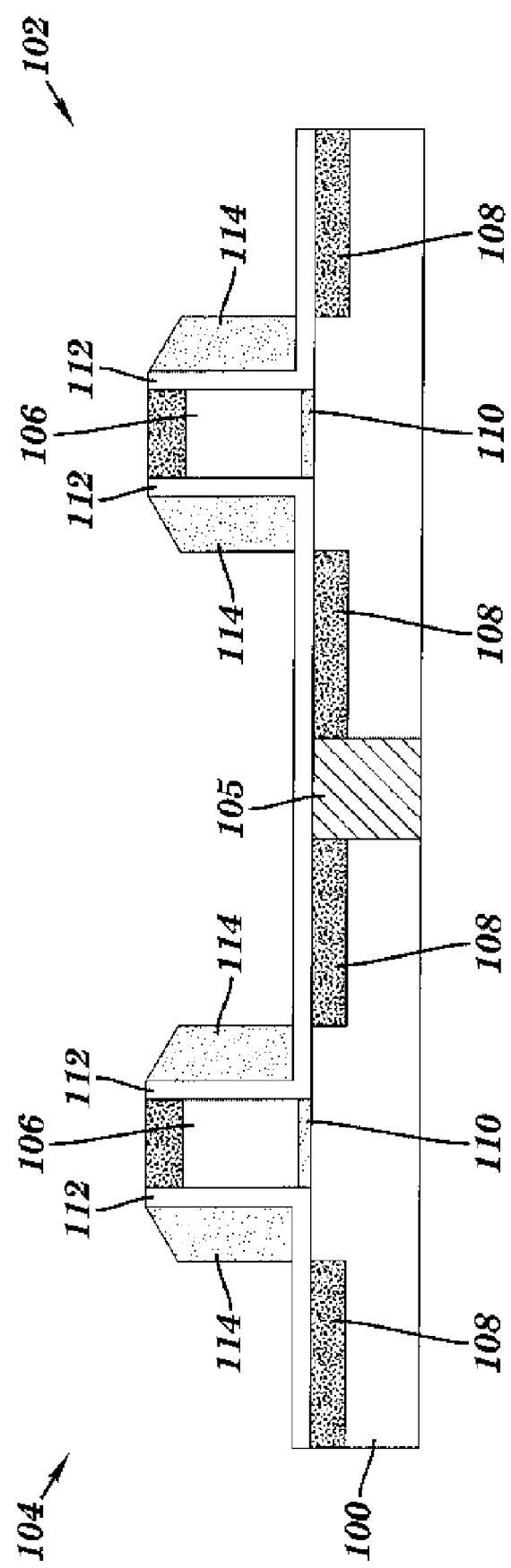
FIG. 1 is a cross sectional view of a semiconductor substrate having a pair of complementary metal oxide semiconductor (CMOS) devices formed thereon, suitable for use in accordance with an embodiment of the invention.

Referring initially to FIG. 1, there is shown a cross sectional view of a semiconductor substrate 100 having a pair of exemplary complementary metal oxide semiconductor (CMOS) devices (i.e., an NFET device 102 and a PFET device 104) formed thereon, and separated from one another by a shallow trench isolation 105. At the particular process stage of device manufacturing shown therein, the silicidation of the gate 106 material (e.g., polysilicon) and doped source/drain diffusion regions 108 has taken place, but prior to the formation of the first interlevel dielectric (ILD) layer thereupon. FIG. 1 further illustrates the gate oxide layers 110 (e.g., SiO$_2$), oxide liner 112 and nitride spacers 114 used in the formation of the NFET 102 and PFET 104, as will be recognized by one skilled in the art.

Figure 2A:
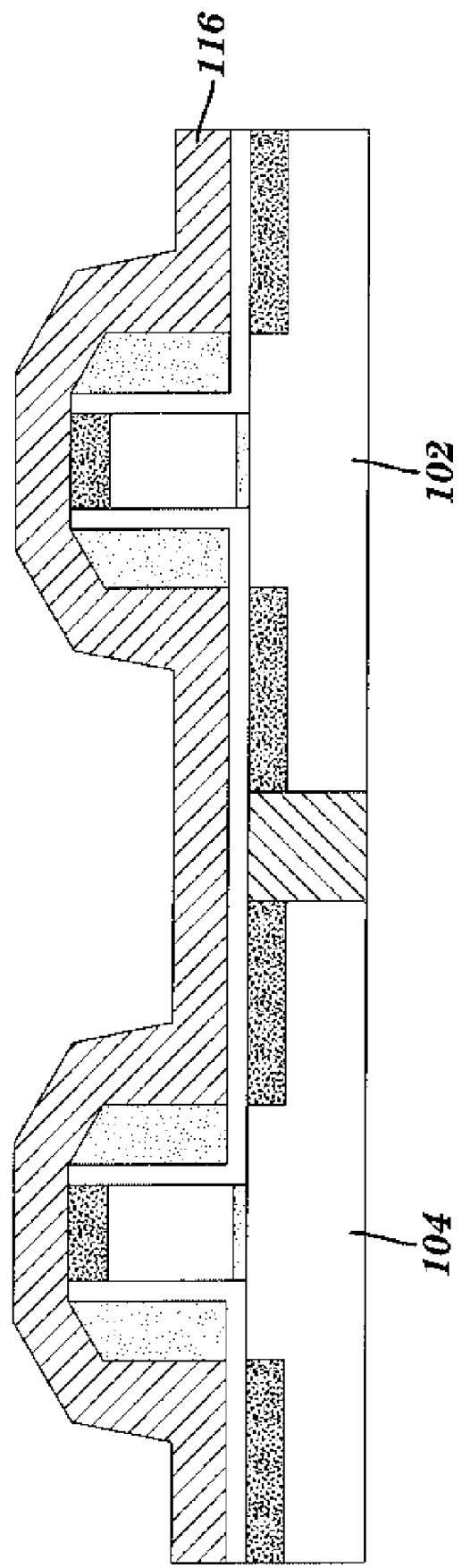
FIGS. 2(a) through 2(k) illustrate an exemplary process flow for forming a self-aligned, dual silicon nitride liner for CMOS devices, in accordance with a first embodiment of the invention.
Figure 2B:
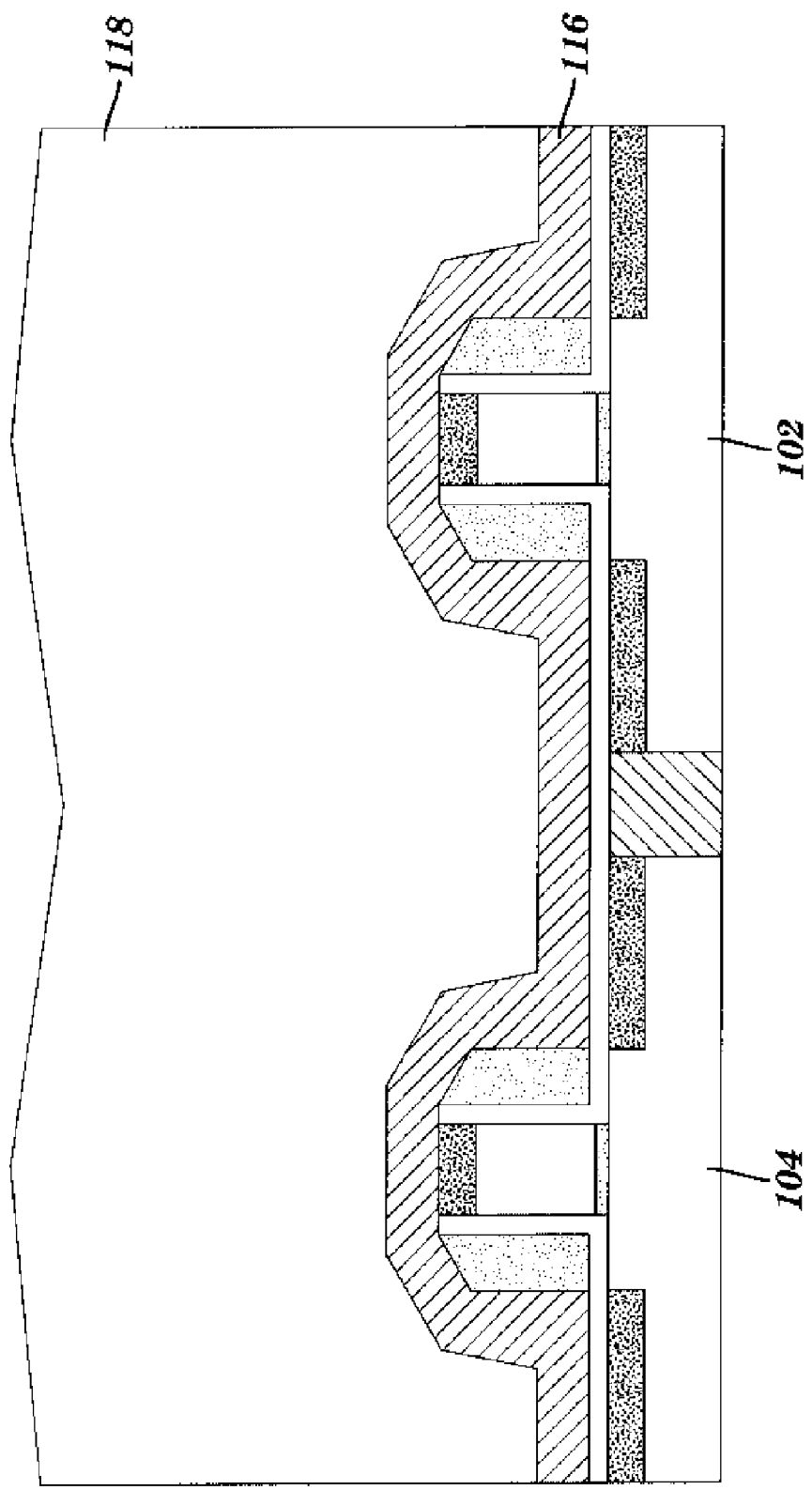
Figure 2C:
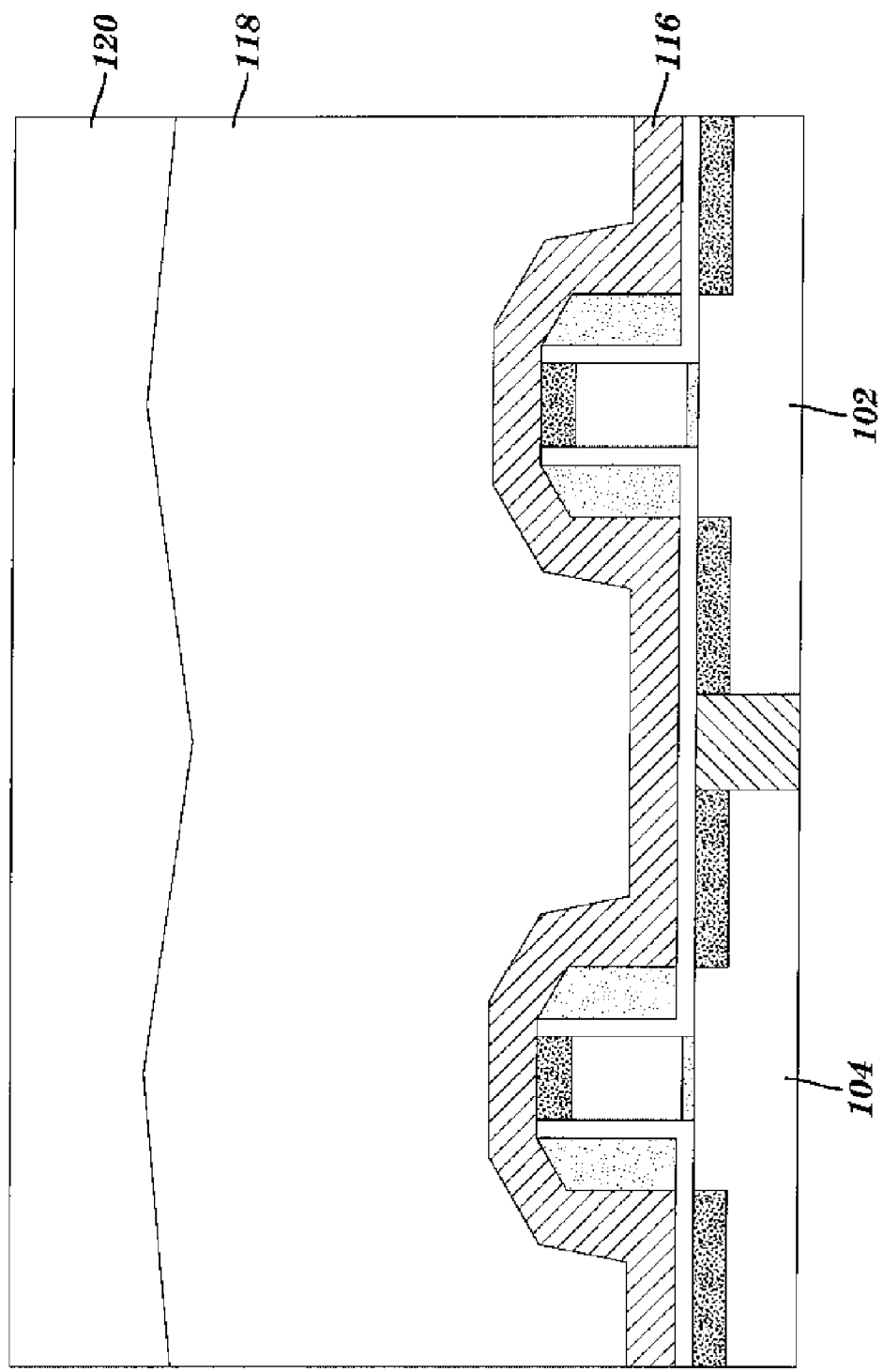

In accordance with a first embodiment, FIGS. 2(a) through 2(h) illustrate an exemplary process flow for forming a self-aligned, dual silicon nitride liner over the silicided NFET 102 and PFET 104 devices. In FIG. 2(a), a tensile silicon nitride layer 116 (e.g., Si$_3$N$_4$ deposited using a BTBAS (Bis(TertiaryButylAmino)Silane) precursor) is formed over the entire structure, at exemplary thickness of about 500 to about 1000 angstroms (Å). Then, in FIG. 2(b), a thick oxide layer 118 is formed over the tensile nitride layer 116 at an exemplary thickness of at least about 1000 Å, and more particularly, to about 5000 Å. A patterning step is implemented wherein a photoresist material 120 is applied and so as to cover the NFET device region (i.e., to expose the PFET device region), as shown in FIG. 2(c).

Figure 2D:
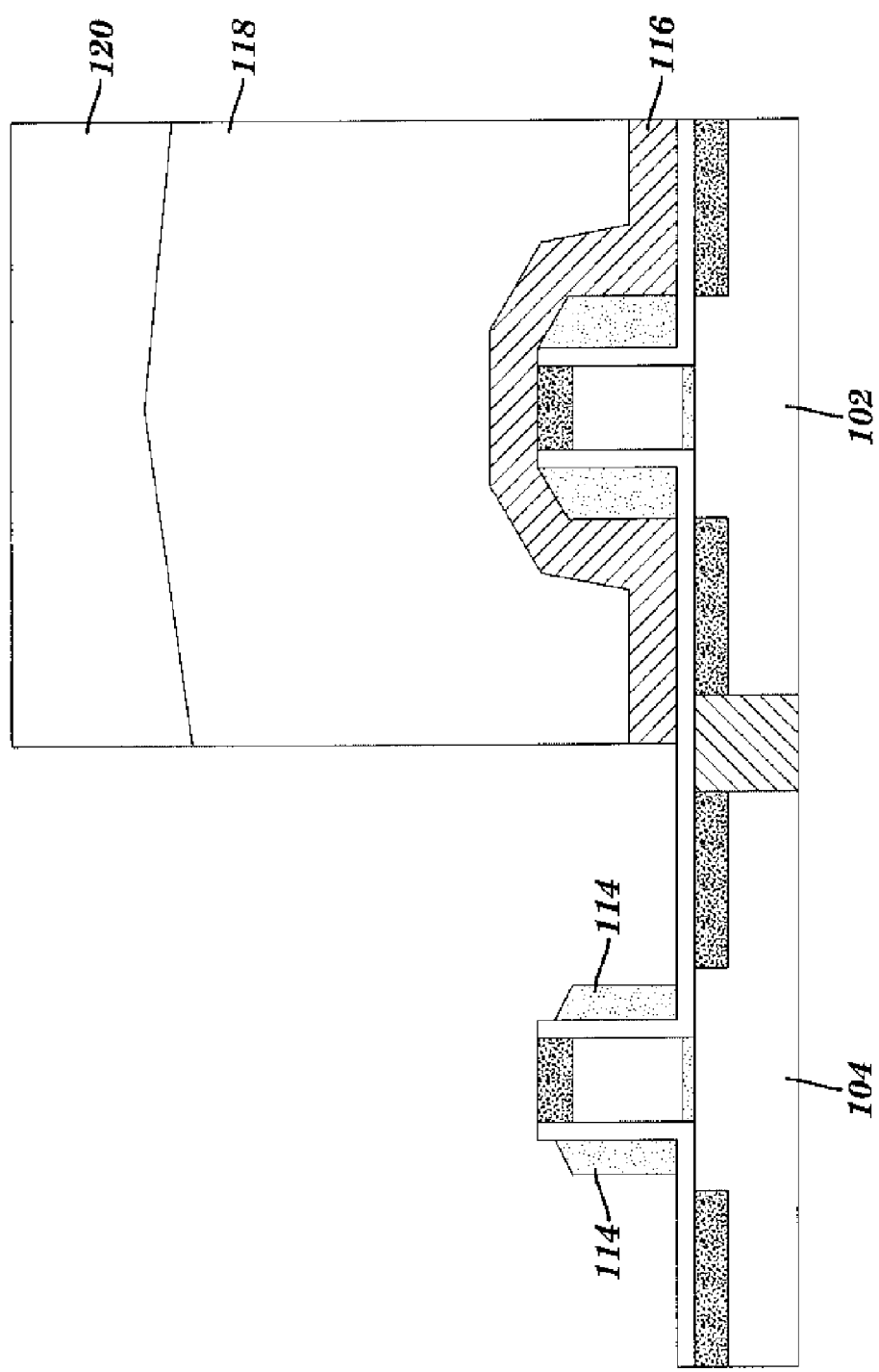
Figure 2E:
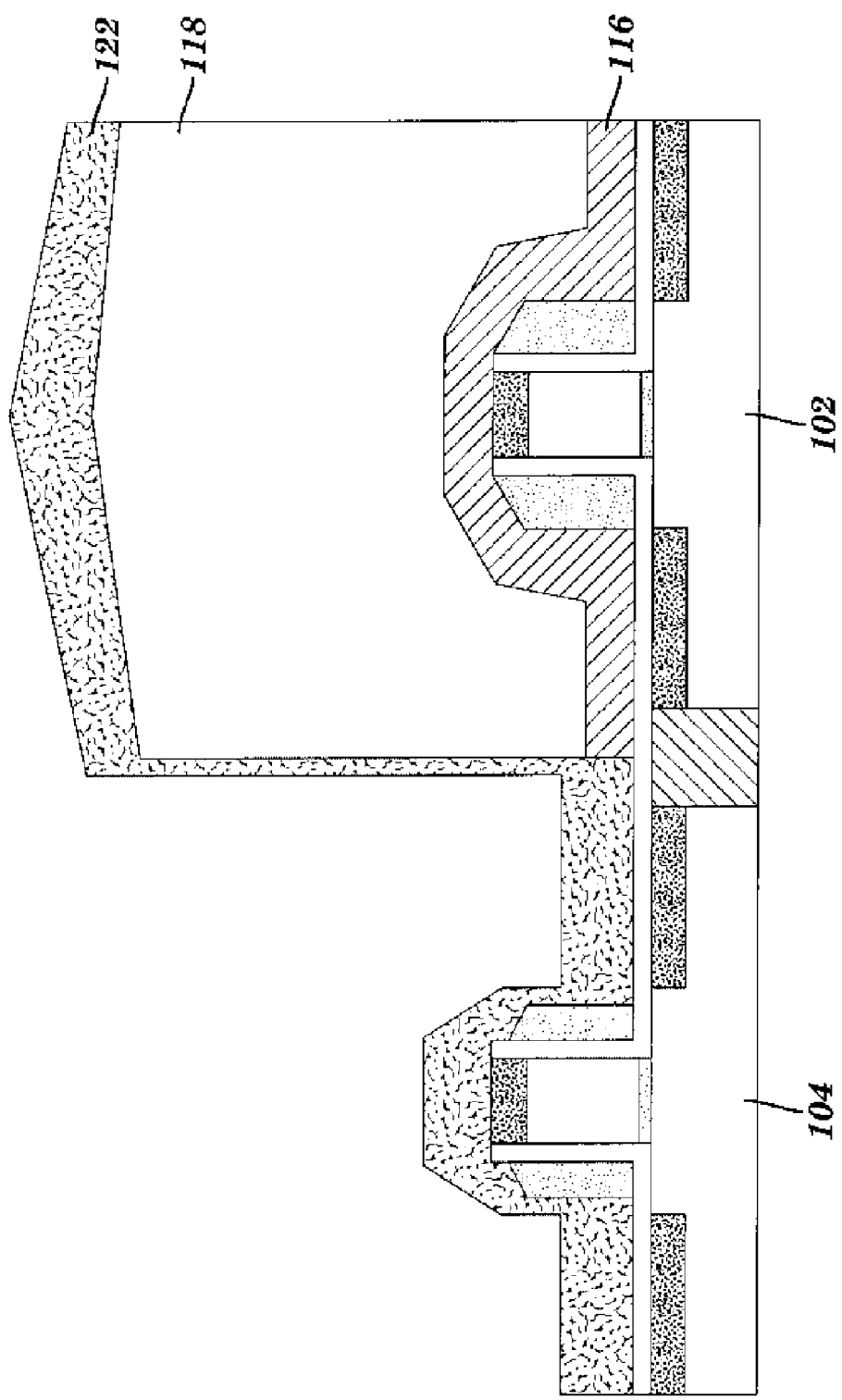
Figure 2F:
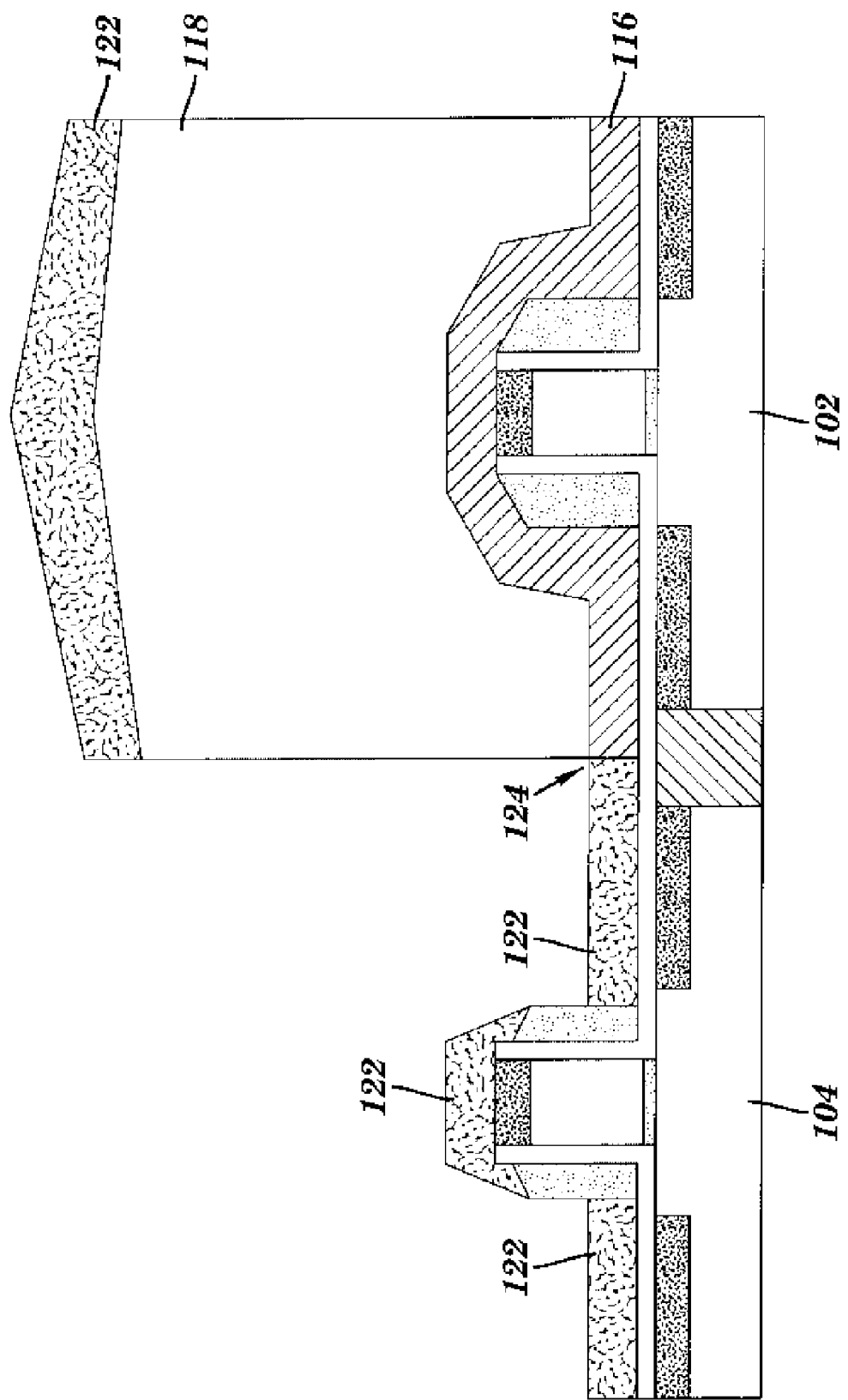

FIG. 2(d) illustrates the removal of the exposed portions of thick oxide layer 118, as well as the tensile nitride layer 116 over PFET device 104. This may be implemented, for example, through a reactive ion etch (RIE) of the oxide and nitride materials. Notably, the sidewall spacers 114 associated with the PFET device 104 are somewhat reduced in size as a result of the removal of the tensile nitride layer 116. Following the removal of the remaining photoresist material 120 over the NFET device 102, a compressive nitride layer 122 is formed over the entire device, as illustrated in FIG. 2(e). In order to form the compressive nitride layer 122 at a greater thickness on the horizontal surfaces than on sidewall surfaces, as shown, the compressive nitride material may be formed by a high density plasma (HDP) deposition or plasma enhanced CVD (PECVD), for example, SiH$_4$/NH$_3$/N$_2$ at about 200° C. to about 500° C. Thus, when the compressive nitride layer 122 is isotropically etched or wet etched, as shown in FIG. 2(f), the portions of the compressive nitride layer 122 originally formed on the sidewall of the thick oxide layer 118 are removed.

Figure 2G:
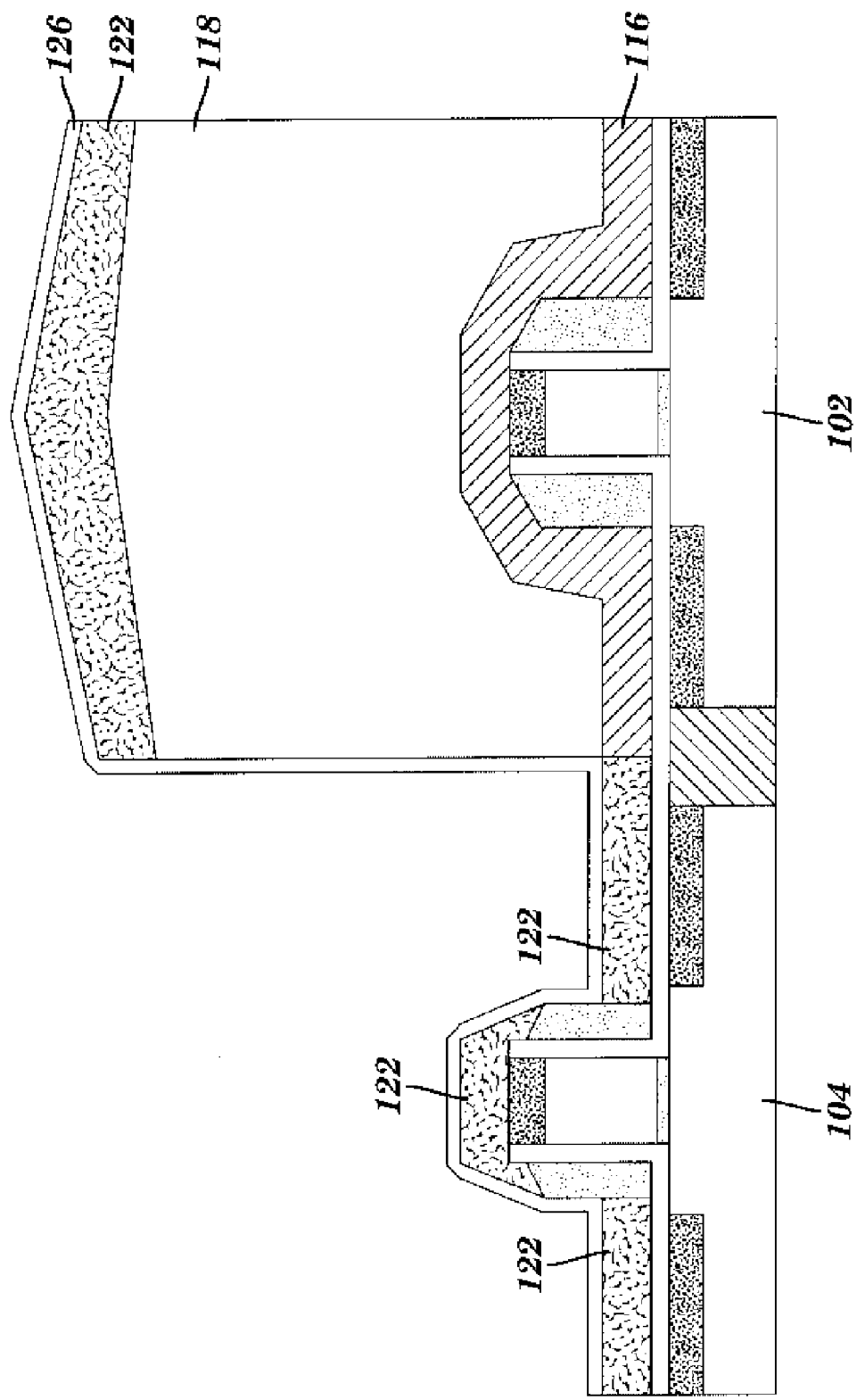
Figure 2H:
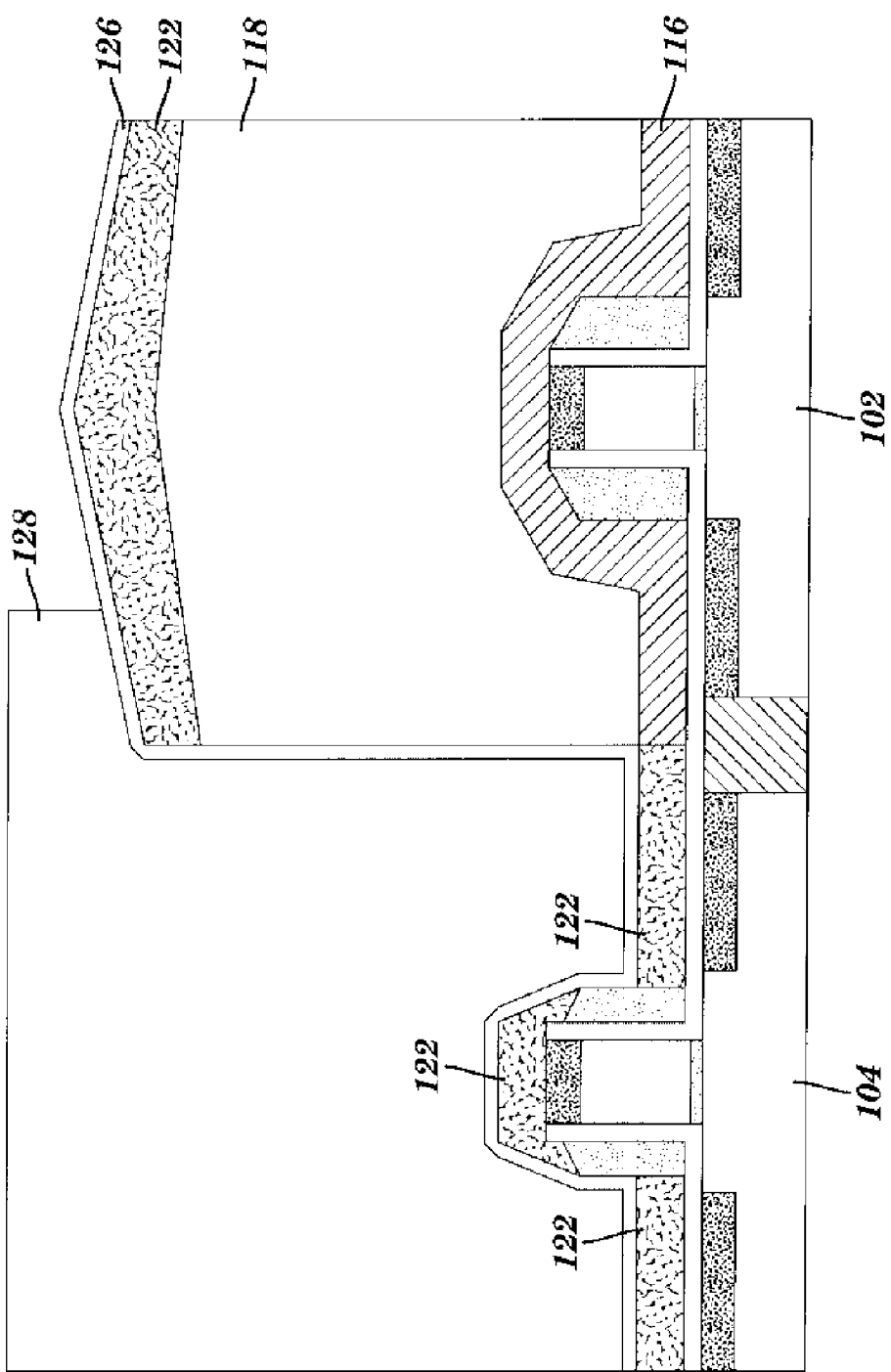
Figure 2I:
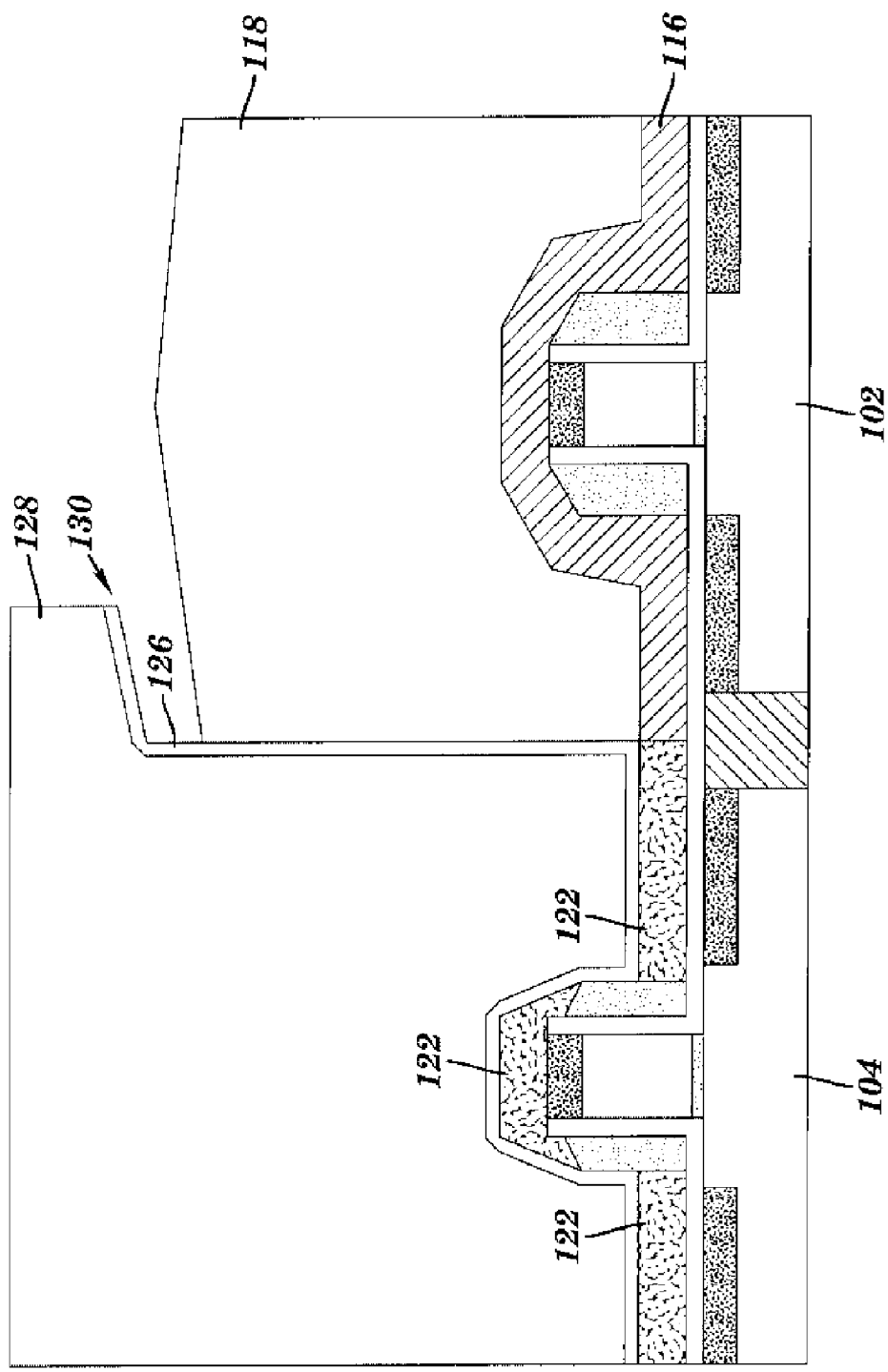

At this point, it will be seen that a self-aligned, sharp interface 124 is defined between compressive nitride layer 122 and tensile nitride layer 116 without the use of a direct second lithographic patterning step for removal of the compressive nitride material over the NFET device 102. However, in order to facilitate the removal thereof, a thin oxide layer 126 (e.g., about 50-100 angstroms) is then formed over the entire structure, as shown in FIG. 2(g). Then, in FIG. 2(h), a photoresist material 128 is formed over the structure and thereafter patterned so as to partially overlap the compressive nitride material 116 remaining over the NFET device 102. The exposed portion of the thin oxide layer 126 above the NFET device 102 is removed, such as by RIE for example, followed by an isotropic or wet etch (for example) to remove the compressive nitride layer 122 over the NFET device 102, stopping on the thick oxide layer 118. This is illustrated in FIG. 2(i). As a result of the patterning overlap, an oxide tip remains over the NFET device 102.

Figure 2J:
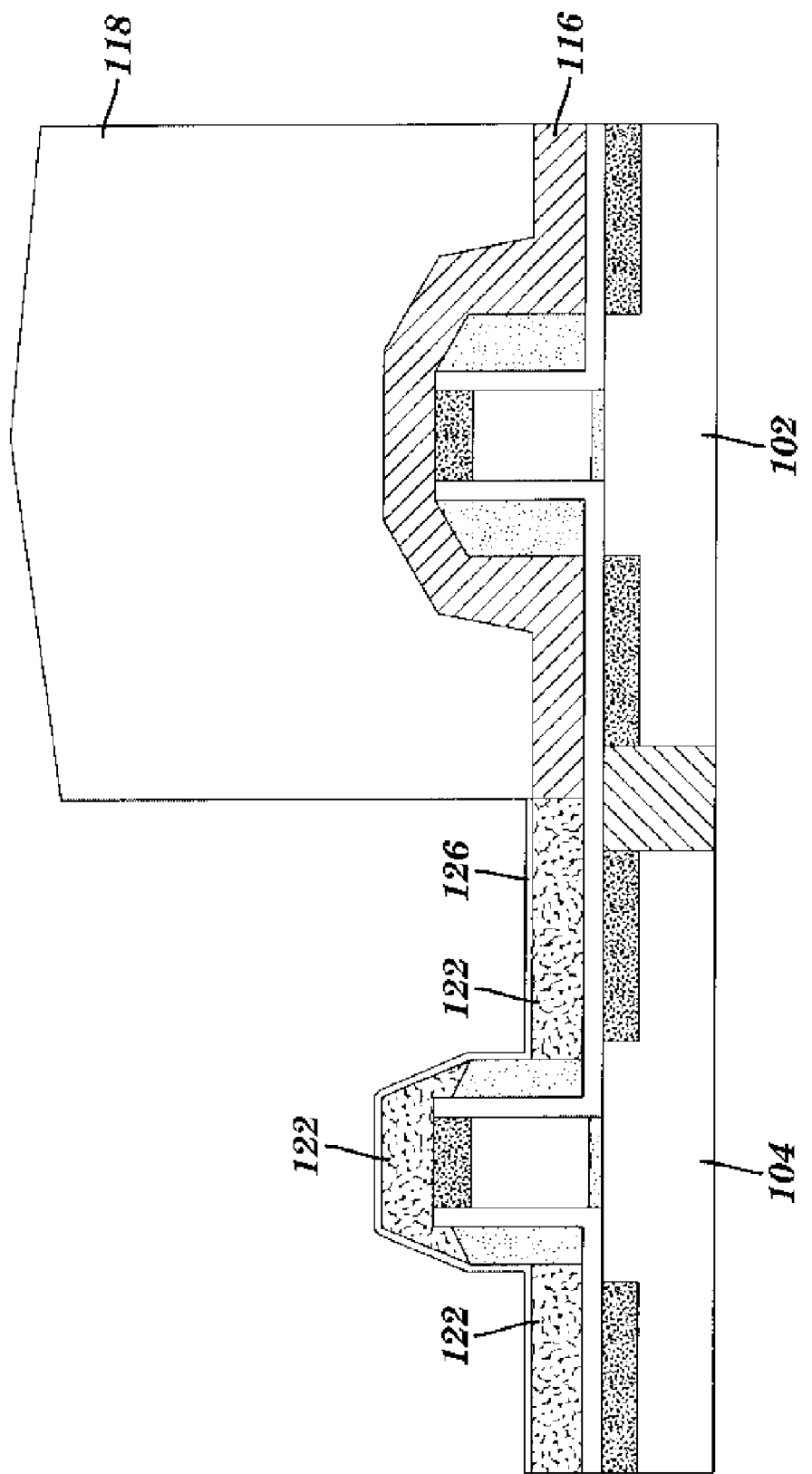
Figure 2K:
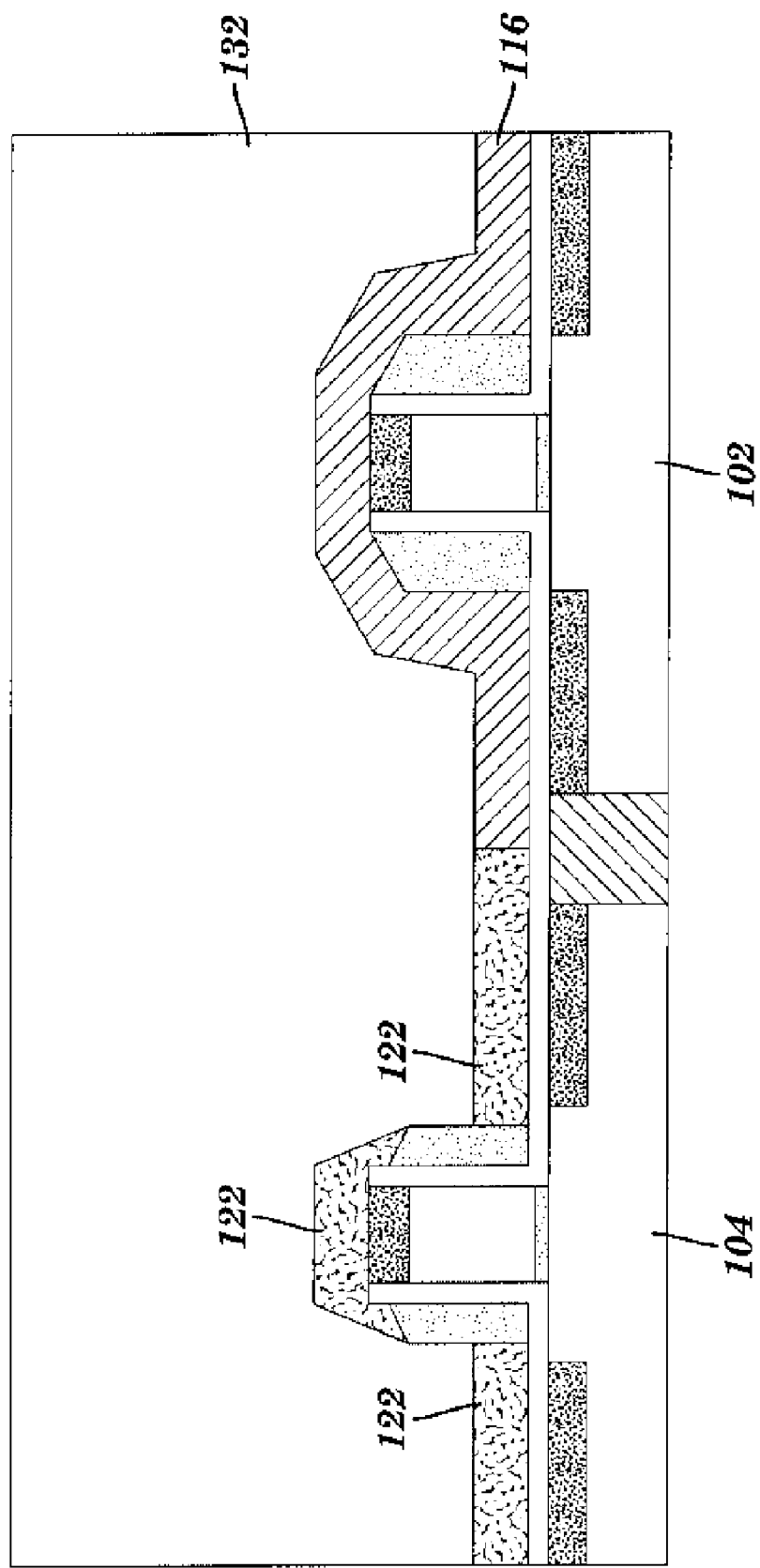

After removing the photoresist material 128, the remaining thin oxide layer 126 is etched until the tip 130 is removed, as shown in FIG. 2(j). This will help to avoid possible voiding during a subsequent ILD deposition. Finally, any remaining thin oxide material 126 and the thick oxide layer may remain in place prior to deposition of ILD oxide 132 and subsequent planarization, as shown in FIG.

2(k). Thereafter, conventional processing may continue to complete the CMOS device. Optionally, the thin oxide layer 126 and thick oxide layer 118 could also be removed prior to forming the ILD oxide 132.

Figure 3A:
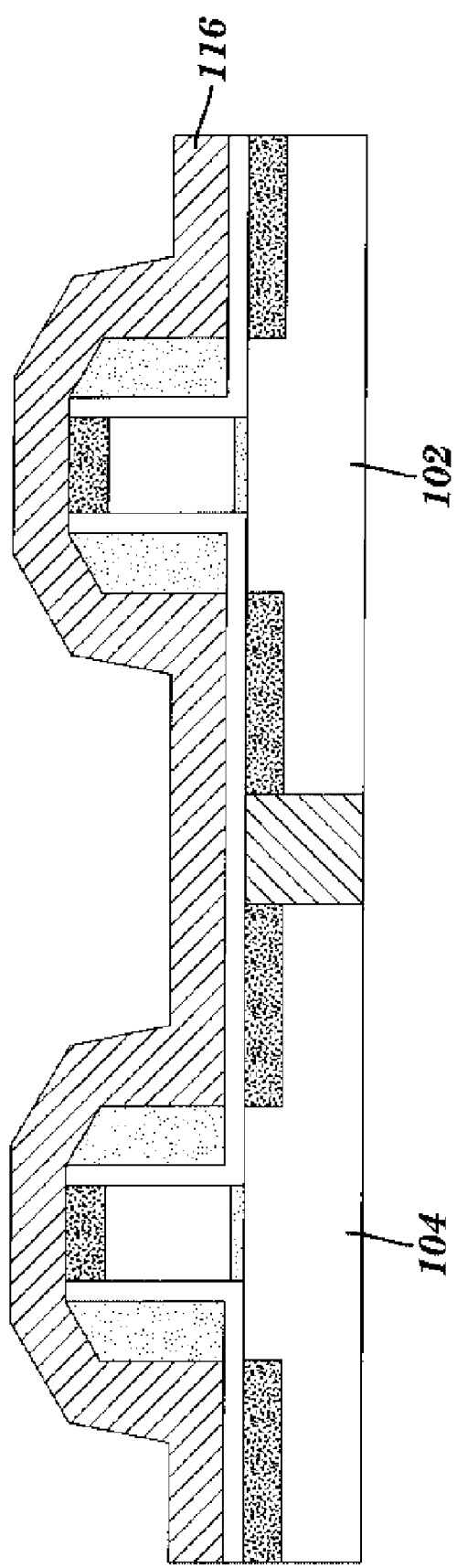
FIGS. 3(a) through 3(j) illustrate an exemplary process flow for forming a self-aligned, dual silicon nitride liner for CMOS devices, in accordance with a second embodiment of the invention.
Figure 3B:
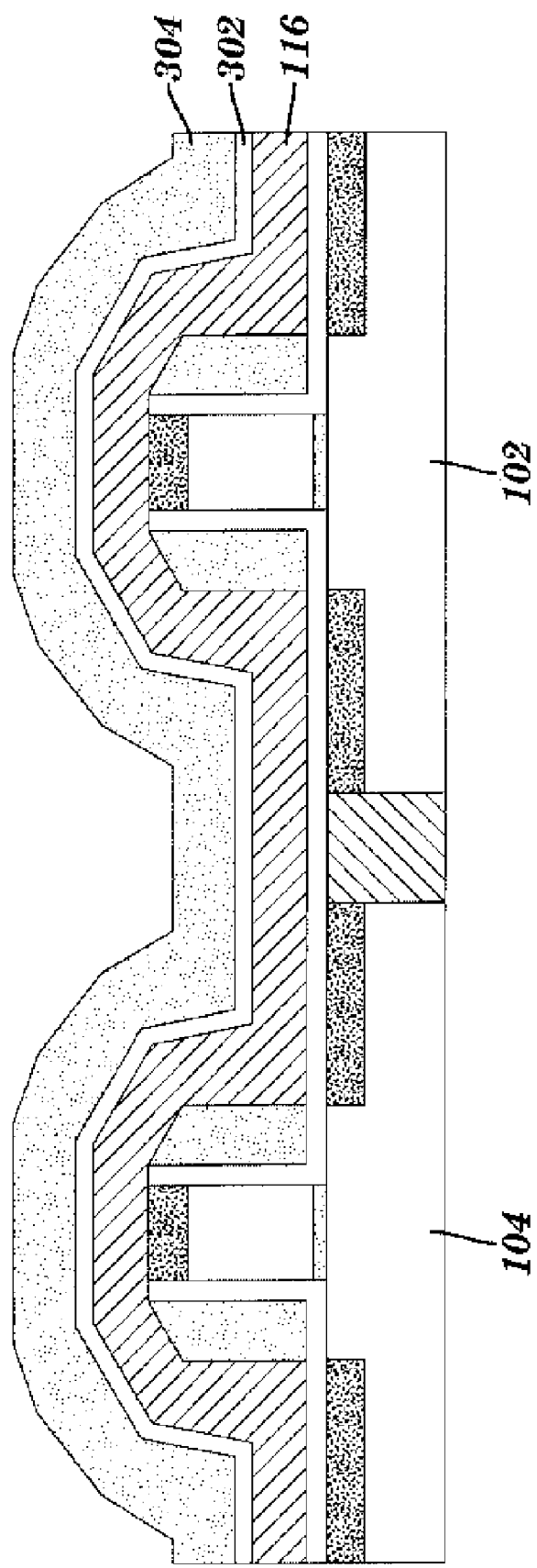
Figure 3C:
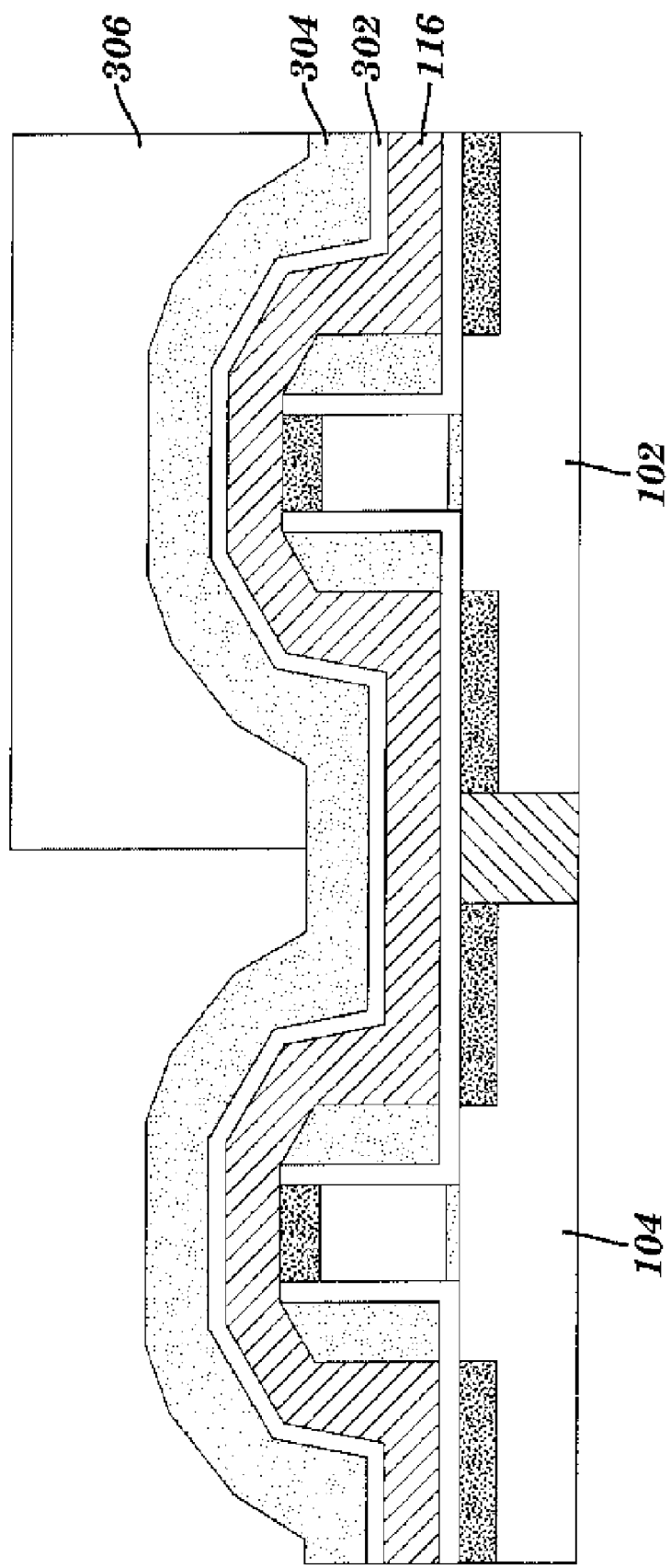

Referring generally now to FIGS. 3(a) through 3(j), another exemplary process flow for forming a self-aligned, dual silicon nitride liner for CMOS devices is illustrated, in accordance with a second embodiment of the invention. As is the case with first embodiment, the process flow of the second embodiment begins in FIG. 3(a) by forming a tensile silicon nitride layer 116 over the entire structure at exemplary thickness of about 500 to about 1000 Å. This is followed by the blanket formation of a thin oxide layer 302 (e.g., about 50-100 Å), and a sacrificial nitride layer 304 (e.g., about 500-700 angstroms), as shown in FIG. 3(b). A patterning step is implemented wherein a photoresist material 306 is applied and so as to cover the NFET device region (i.e., to expose the PFET device region), as shown in FIG. 3(c).

Figure 3D:
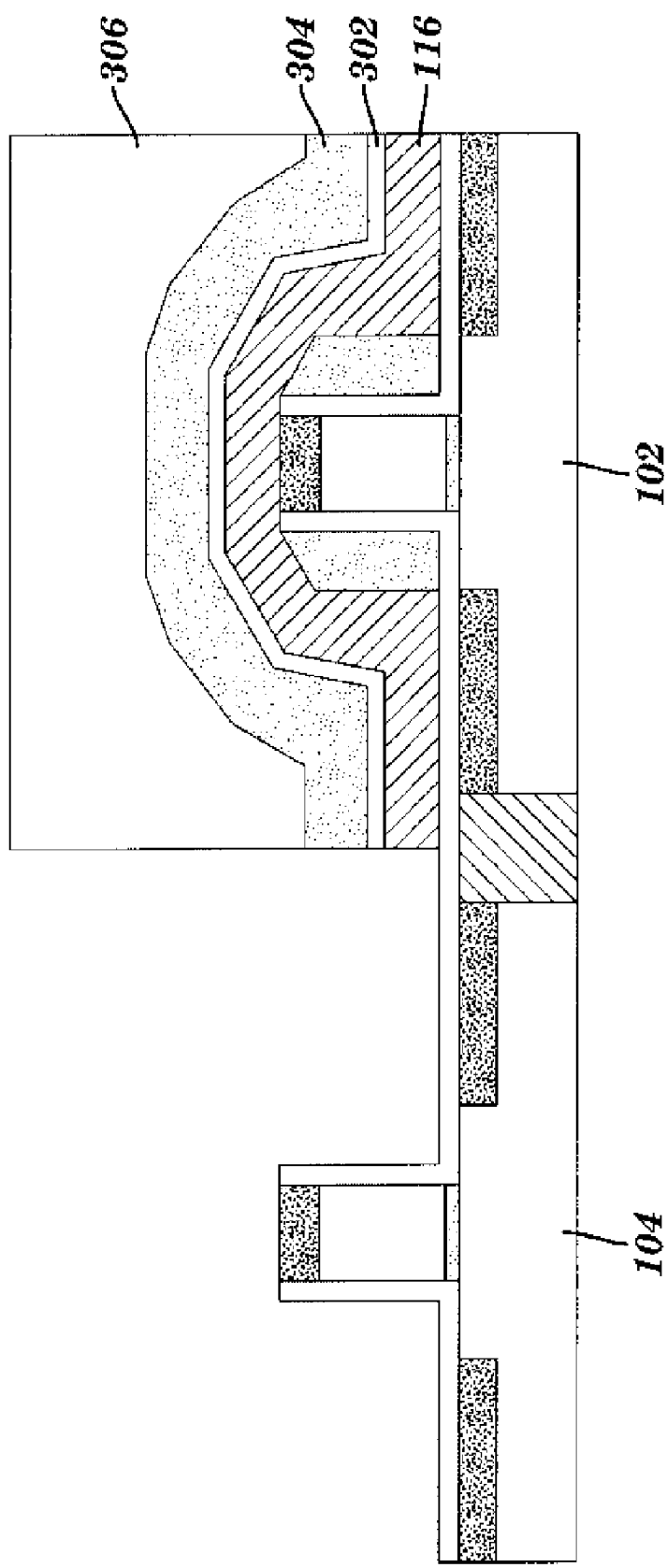
Figure 3E:
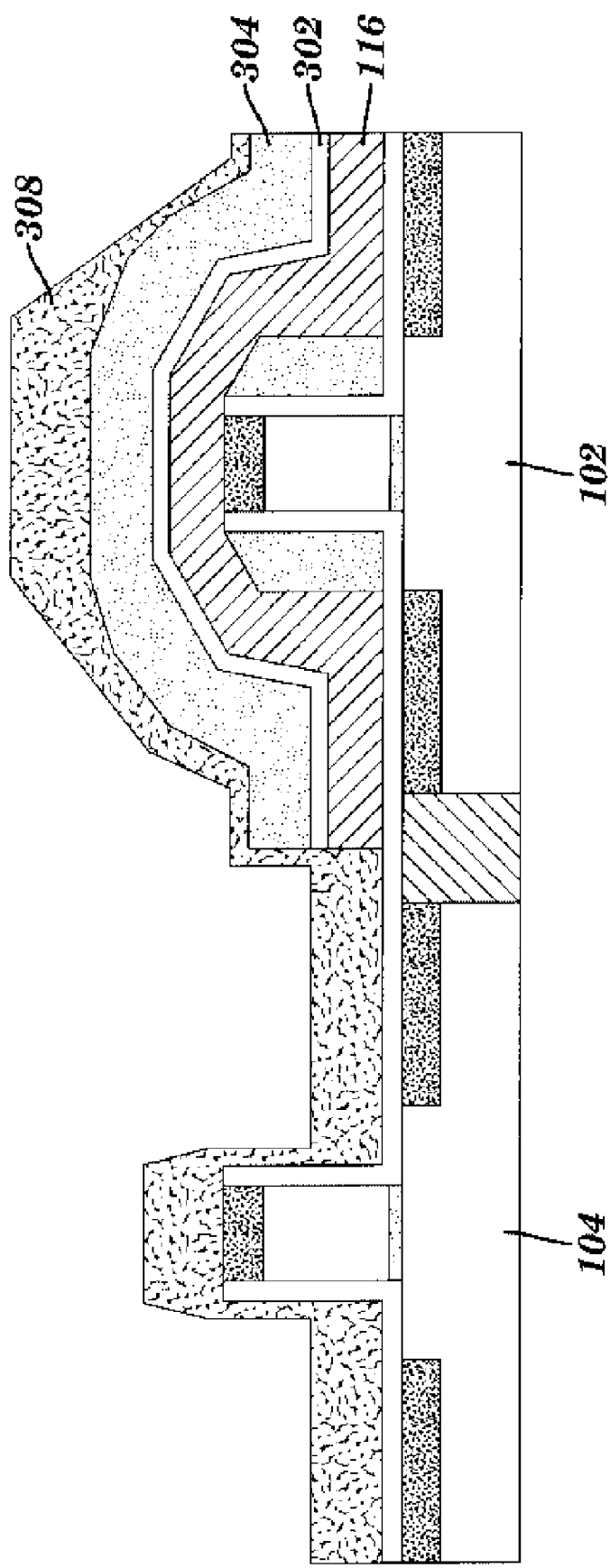
Figure 3F:
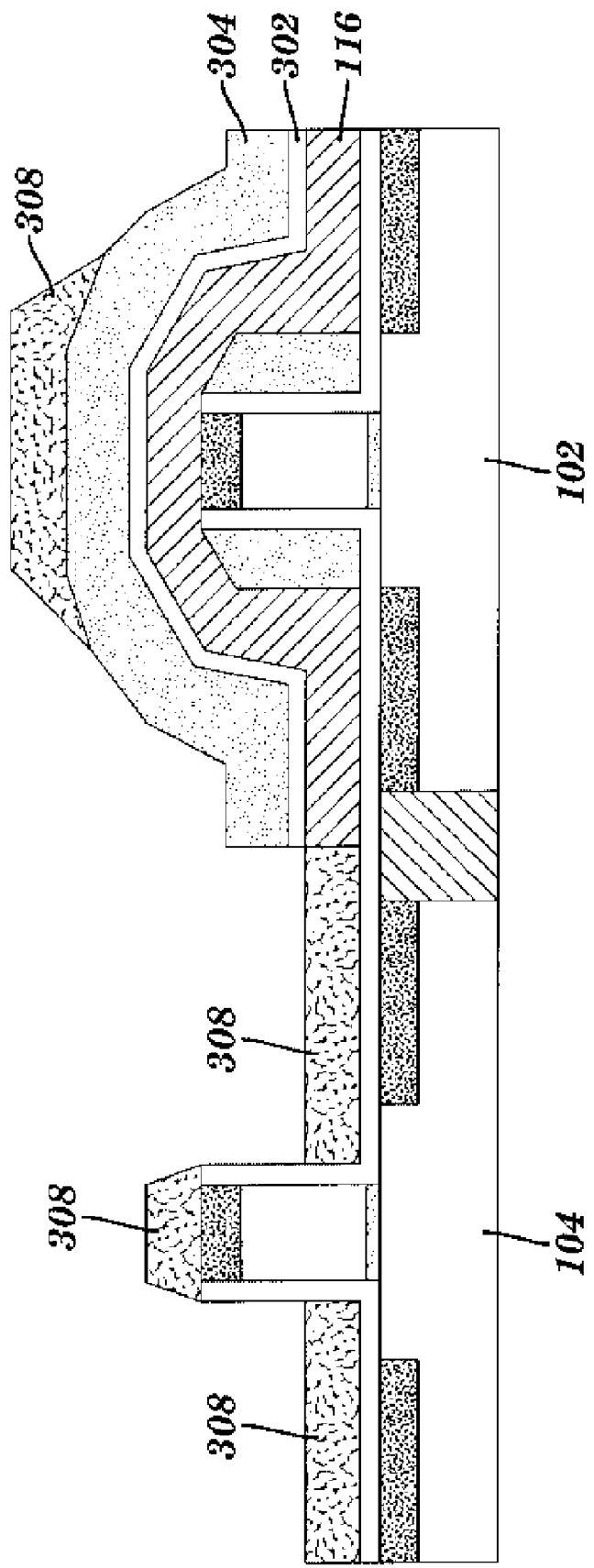

FIG. 3(d) illustrates the removal of the exposed portions of the sacrificial nitride layer 304, the thin oxide layer 302, and the tensile nitride layer 116 over PFET device 104. This may be implemented, for example, through succession of a reactive ion RIE of the nitride, oxide and (again) nitride materials. Notably, the sidewall spacers associated with the PFET device 104 are also removed as a result of the removal of the tensile nitride layer 116. Following the removal of the remaining photoresist material 306 over the NFET device 102, a compressive nitride layer 308 is formed over the entire device, as illustrated in FIG. 3(e). In order to form the compressive nitride layer 308 at a greater thickness on the horizontal surfaces than on sidewall surfaces, as shown, the compressive nitride material may be formed by a high density plasma (HDP) deposition and PECVD, for example, $SiH_4/NH_3/N_2$ at about 200° C. to about 500° C. Moreover, the compressive nitride layer 308 may be formed at a slightly greater horizontal thickness (e.g., about 600-1200 Å) with respect to the tensile nitride layer 116.

When the compressive nitride layer 308 is isotropically etched or wet etched (by an exemplary thickness of about 100-200 Å), as shown in FIG. 2(f), the portions of the compressive nitride layer 308 originally formed on the various sidewall topographic surfaces are removed. Moreover, the resulting thickness of the compressive nitride layer 308 is roughly equivalent to the thickness of the tensile nitride layer 116. In addition, a self-aligned, sharp interface 310 is defined between compressive nitride layer 308 and tensile nitride layer 116 without the use of a direct second lithographic patterning step for removal of the compressive nitride material over the NFET device 102.

Figure 3G:
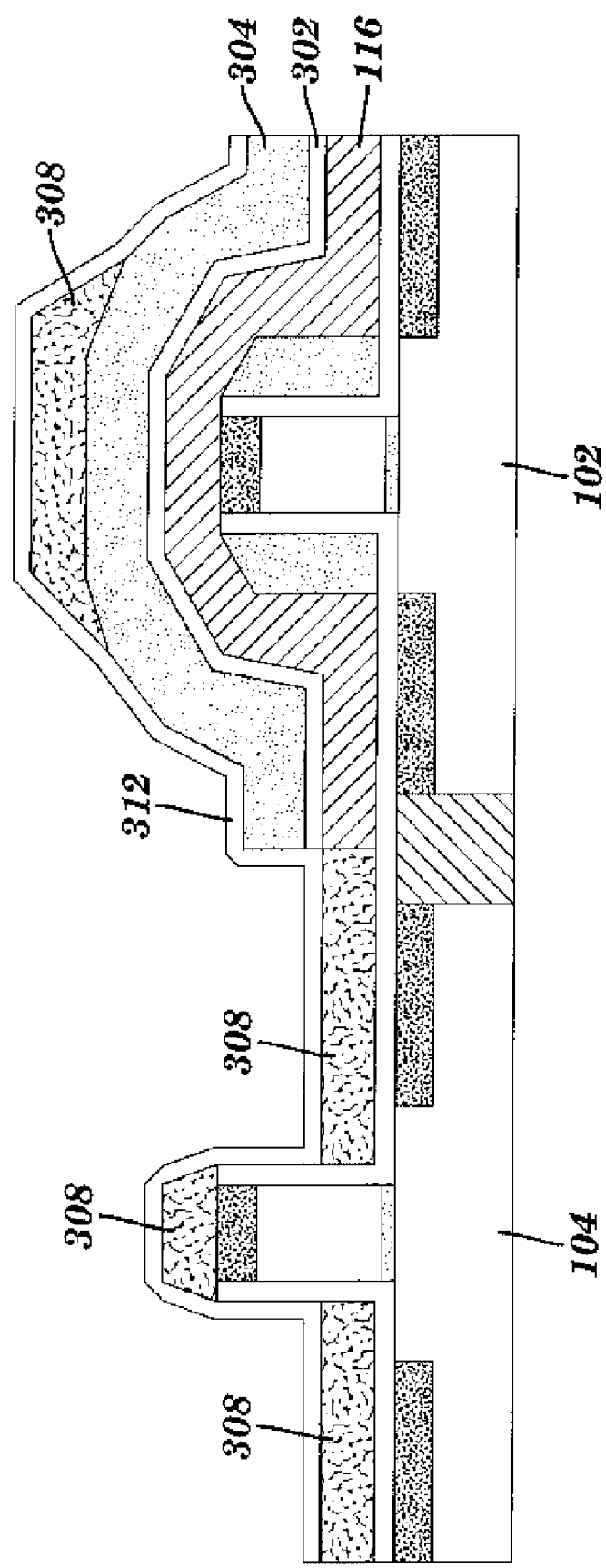
Figure 3H:
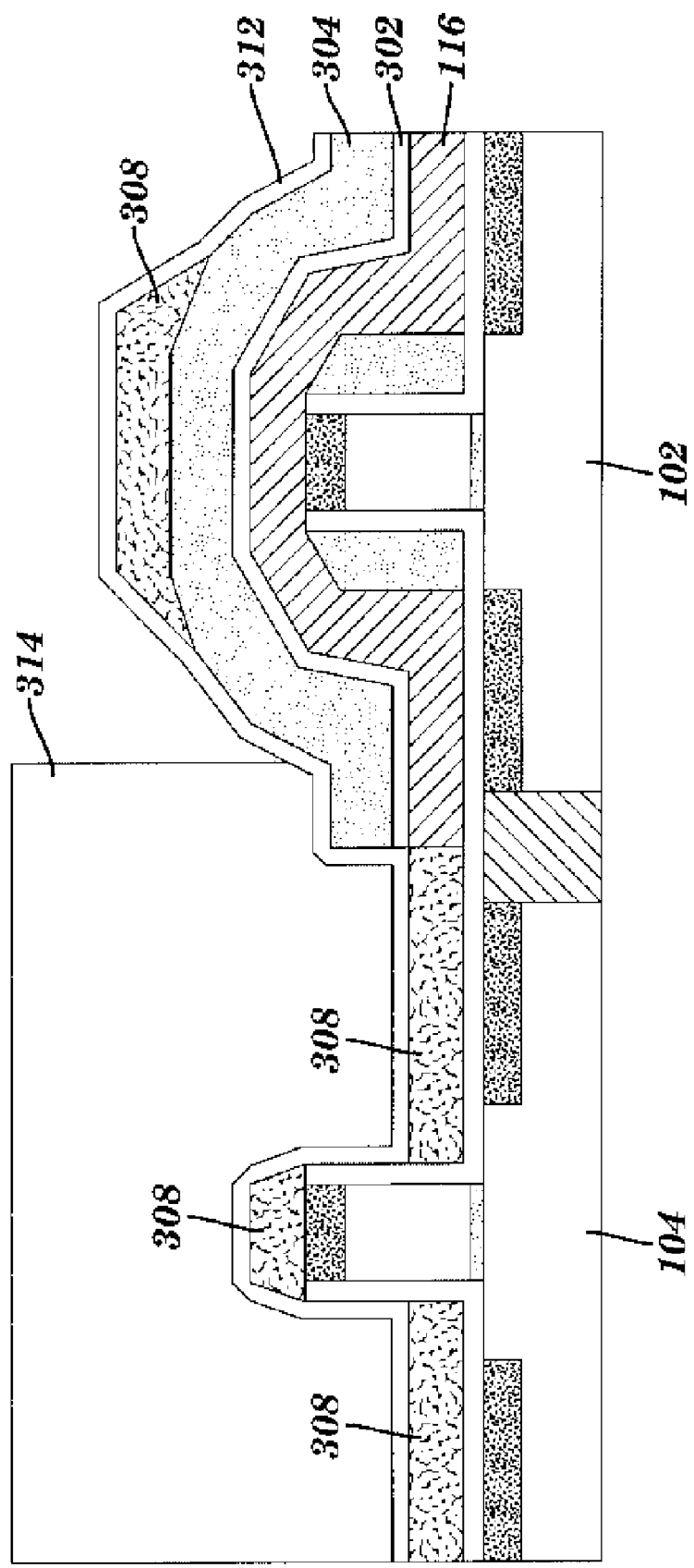
Figure 3I:
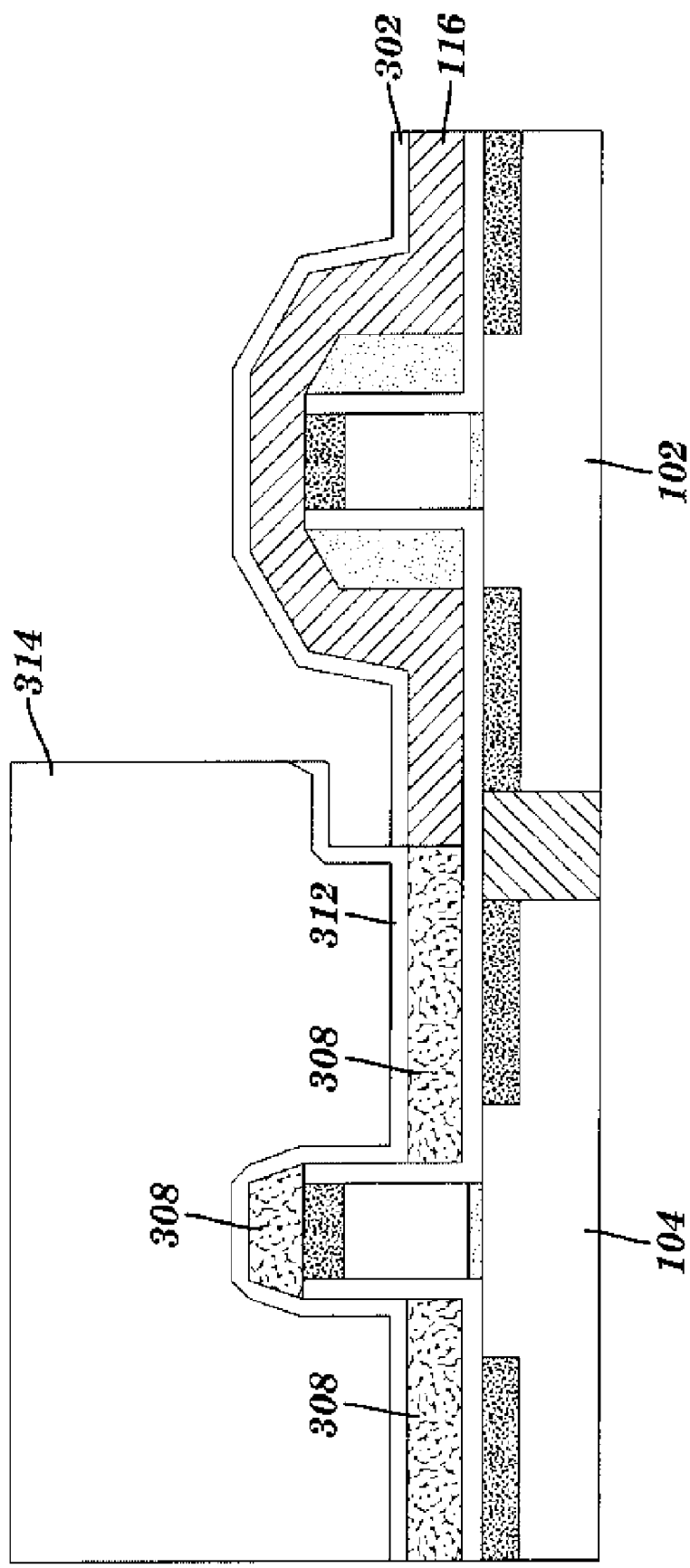
Figure 3J:
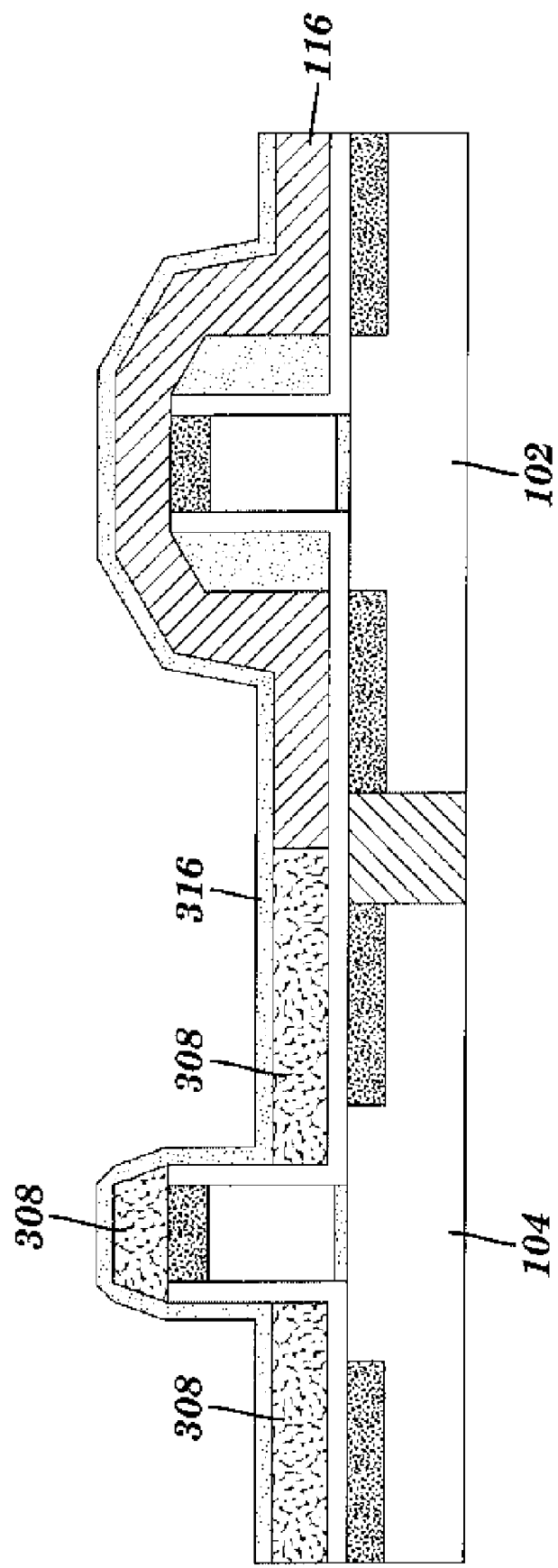

However, in order to selectively remove of the compressive nitride material over the NFET device 102, a thin oxide layer 312 (e.g., about 50-100 angstroms) is then formed over the entire structure, as shown in FIG. 3(g). Then, in FIG. 3(h), a photoresist material 314 is formed over the structure and thereafter patterned so as to partially overlap the sacrificial nitride material 304 remaining over the NFET device 102 (but not over the tensile nitride material 308 over NFET device 102). The exposed portion of the thin oxide layer 312 above the NFET device 102 is removed, such as by RIE for example, followed by an isotropic or wet etch (for example) to remove the compressive nitride layer 308 over the NFET device 102, stopping on the thin oxide layer 302. This is illustrated in FIG. 3(i). As a result of the patterning overlap, an oxide tip remains over the NFET device 102. Finally, as shown in FIG. 3(j), the remaining photoresist layer 314 is removed, followed by a wet etch of the remaining thin oxide material (i.e., layers 312, 302 from FIG. 3(i)). Because the original sidewall spacers of the PFET device 104 were removed in FIG. 3(d), a protective thin nitride layer 316 is deposited. From this point, conventional device processing operation can continue to complete the CMOS structure.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a self-aligned, dual stress liner for a complementary metal oxide semiconductor (CMOS) device, the method comprising:

forming a first type stress layer over a first polarity type device and a second polarity type device;

forming a sacrificial layer over said first type stress layer;

patterning and removing portions of said first type stress layer and said sacrificial layer over said second polarity type device;

forming a second type stress layer over said second polarity type device, and over remaining portions of said sacrificial layer over said first polarity type device in a manner such that said second type stress layer is formed at a greater thickness over horizontal surfaces than over sidewall surfaces;

removing portions of said second type stress layer on sidewall surfaces; and removing portions of said second type stress layer over said first polarity type device.

2. The method of claim 1, wherein said first type stress layer is a tensile nitride layer and said second type stress layer is a compressive nitride layer.

3. The method of claim 2, wherein said first polarity type device is an NFET device, and said second polarity type device is a PFET device.

4. The method of claim 3, wherein at least a portion of sidewall spacer material associated with said PFET device is removed during the removal of said tensile nitride layer.

5. The method of claim 3, wherein said sacrificial layer further comprises a thick oxide layer formed at a thickness of at least about 1000 angstroms.

6. The method of claim 5, wherein said removing portions of said compressive nitride layer over said NFET device further comprises:

forming a thin oxide layer over both NFET and PFET regions of the CMOS device, said thin oxide layer formed at a thickness of about 50 to about 100 angstroms;

patterning and etching a portion of said thin oxide layer over said NFET region; and removing said remaining portions of said compressive nitride layer over said NFET device, using said thick oxide layer as an etch stop layer.

7. The method of claim 6, wherein said thin oxide layer is patterned so as to partially overlap said compressive nitride layer over said NFET device so as to create an oxide tip following the removal of said compressive nitride layer over said NFET device.

8. The method of claim 7, further comprising removing at least said oxide tip portion of said thin oxide layer.

9. The method of claim 3, wherein said sacrificial layer further comprises:
- a first thin oxide layer formed at a thickness of about 50 to about 100 angstroms; and
- a sacrificial nitride layer formed at a thickness of about 500 to about 700 angstroms.

10. The method of claim 9, wherein said removing portions of said compressive nitride layer over said NFET device further comprises:
- forming a second thin oxide layer over both NFET and PFET regions of the CMOS device, said second thin oxide layer formed at a thickness of about 50 to about 100 angstroms;
- patterning and etching a portion of said second thin oxide layer over said NFET region; and
- removing said sacrificial nitride layer and said compressive nitride layer over said NFET device, using said first thin oxide layer as an etch stop layer.

11. The method of claim 10, further comprising:
- removing remaining portions of said first and said second thin oxide layers; and
- forming a thin nitride layer over both NFET and PFET regions of the CMOS device.

12. The method of claim 3, wherein said compressive nitride layer is formed at an initial thickness greater than said tensile nitride layer, such that following said removing portions of said compressive nitride layer on sidewall surfaces, the resulting thickness of said compressive nitride layer is substantially equal to the thickness of said tensile nitride layer.

13. A method for forming a self-aligned, dual material liner for semiconductor devices, the method comprising:
- forming a first type layer over a substrate;
- forming a sacrificial layer over said first type layer;
- patterning and removing portions of said first type layer and said sacrificial layer over a first area of the substrate;
- forming a second type layer over said first area of the substrate, and over remaining portions of said sacrificial layer over a second area of the substrate in a manner such that said second type layer is formed at a greater thickness over horizontal surfaces than over sidewall surfaces;
- removing portions of said second type layer on sidewall surfaces; and
- removing portions of said second type nitride layer over said second area of the substrate.

* * * * *